United States Patent
Yoon et al.

(10) Patent No.: US 10,685,968 B2
(45) Date of Patent: Jun. 16, 2020

(54) ANTI-FUSE ONE-TIME PROGRAMMABLE (OTP) DEVICE

(71) Applicant: Samsung Electronics Co., Ltd., Suwon-si, Gyeonggi-do (KR)

(72) Inventors: Jihoon Yoon, Seoul (KR); Hyun-Min Choi, Uiwang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/399,243

(22) Filed: Jan. 5, 2017

(65) Prior Publication Data
US 2017/0200727 A1    Jul. 13, 2017

(30) Foreign Application Priority Data

Jan. 8, 2016 (KR) .................. 10-2016-0002686

(51) Int. Cl.
*H01L 27/112* (2006.01)
*H01L 23/525* (2006.01)
*H01L 23/522* (2006.01)

(52) U.S. Cl.
CPC .... *H01L 27/11206* (2013.01); *H01L 23/5226* (2013.01); *H01L 23/5252* (2013.01)

(58) Field of Classification Search
CPC .......... H01L 27/112–11597; H01L 2924/1453; H01L 23/5252; H01L 23/5256; H01L 2924/145–1453; H01L 23/525–5258; H01L 23/5382; G11C 17/14–165
See application file for complete search history.

(56) References Cited

U.S. PATENT DOCUMENTS

| | | | |
|---|---|---|---|
| 7,312,513 B1 * | 12/2007 | Wilcox | ............ H01L 23/5252 257/50 |
| 8,330,189 B2 | 12/2012 | Luan et al. | |
| 8,679,929 B2 | 3/2014 | Pan et al. | |
| 8,748,235 B2 | 6/2014 | Mitchell et al. | |
| 9,013,910 B2 * | 4/2015 | Chen | ............... G11C 17/18 257/317 |
| 9,196,377 B1 * | 11/2015 | Park | ............... H01L 27/11206 |
| 9,263,450 B2 | 2/2016 | Jeon | |
| 9,281,074 B2 | 3/2016 | Wu et al. | |

(Continued)

FOREIGN PATENT DOCUMENTS

JP    2014/225658 A    12/2014
KR    2014/0018575 A    2/2014

*Primary Examiner* — Younes Boulghassoul
(74) *Attorney, Agent, or Firm* — Harness, Dickey & Pierce, P.L.C.

(57) ABSTRACT

A semiconductor device is disclosed. The semiconductor device including writing and reading gate electrodes respectively on first and second active regions on a substrate, a first gate insulation pattern between the first active region and the writing gate electrode, a second gate insulation pattern between the second active region and the reading gate electrode, first and second source/drain junction regions in the first and second active regions at sides of the writing and reading gate electrodes, and a connection structure that connects the first and second source/drain junction regions. The first active region has the same conductivity type as the source/drain junction regions. The second active region has a different conductivity type from the source/drain junction regions.

21 Claims, 13 Drawing Sheets

(56) References Cited

U.S. PATENT DOCUMENTS

| | | | |
|---|---|---|---|
| 9,331,085 B2 | 5/2016 | Choi et al. | |
| 9,443,860 B1* | 9/2016 | Sung | H01L 27/11206 |
| 9,502,426 B1* | 11/2016 | Kuo | H01L 21/823462 |
| 9,589,970 B1* | 3/2017 | Tseng | H01L 27/11206 |
| 9,589,971 B1* | 3/2017 | Chang | G11C 17/16 |
| 2007/0007621 A1* | 1/2007 | Omura | H01L 23/5256 257/529 |
| 2008/0232162 A1 | 9/2008 | Kuan et al. | |
| 2009/0267160 A1* | 10/2009 | Ichise | H01L 23/5252 257/369 |
| 2010/0133649 A1* | 6/2010 | Lin | H01L 23/5256 257/529 |
| 2011/0223723 A1* | 9/2011 | Candelier | H01L 27/112 438/131 |
| 2012/0211841 A1* | 8/2012 | Kurjanowicz | G11C 17/16 257/369 |
| 2013/0294142 A1* | 11/2013 | Candelier | G11C 17/165 365/96 |
| 2013/0322150 A1* | 12/2013 | Kim | G11C 17/16 365/104 |
| 2014/0293673 A1* | 10/2014 | Wu | G11C 17/16 365/96 |
| 2014/0340955 A1* | 11/2014 | Wu | H01L 27/11206 365/104 |
| 2015/0108559 A1 | 4/2015 | Hee et al. | |
| 2015/0123209 A1* | 5/2015 | Choi | H01L 27/11206 257/379 |
| 2015/0146471 A1* | 5/2015 | Kim | H01L 23/5252 365/96 |
| 2015/0302932 A1* | 10/2015 | Yanagisawa | G11C 13/0069 365/96 |
| 2015/0380102 A1 | 12/2015 | Choi et al. | |
| 2016/0093621 A1* | 3/2016 | Choi | H01L 27/1126 257/365 |
| 2016/0141295 A1* | 5/2016 | Wu | H01L 27/11206 365/96 |
| 2017/0148801 A1* | 5/2017 | Wong | H01L 23/5226 |

* cited by examiner

ANTI-FUSE ONE-TIME PROGRAMMABLE (OTP) DEVICE

CROSS-REFERENCE TO RELATED APPLICATIONS

This U.S. non-provisional patent application claims priority under 35 U.S.C. § 119 of Korean Patent Application 10-2016-0002686 filed on Jan. 8, 2016, the entire contents of which are hereby incorporated by reference.

BACKGROUND

The inventive concepts relate to a semiconductor device and/or to a semiconductor device including a one-time programmable device.

Non-volatile memory devices are classified into one-time programmable (OTP) device and multi-time programmable (MTP) device according to a limit on the number of programming times. The OTP device is referred to a memory that is one-time programmable only, i.e., where additional programming is not available, on a circuit. The OTP device includes fuse, anti-fuse, and e-fuse types. Since it is impossible to erase the programmed data without an additional apparatus, only one-time programming is available to the OTP device.

For the characteristics stated above, OTP devices are used as devices having an improved security function and high-performance, and OTP devices have been increasingly in demand.

SUMMARY

Some example embodiments of the inventive concepts provide an electrode assembly which can be easily fabricated owing to its minimized number of components.

According to some example embodiments of the inventive concepts, a semiconductor device may include a substrate including a first active region and a second active region, a writing gate electrode on the first active region, a reading gate electrode on the second active region, a first gate insulation pattern between the first active region and the writing gate electrode, a second gate insulation pattern between the second active region and the reading gate electrode, a first source/drain junction region in the first active region at one side of the writing gate electrode, a second source/drain junction region in the second active region at one side of the reading gate electrode, and a connection structure that connects the first source/drain junction region to the second source/drain junction region. The first active region may have the same conductivity type as the conductivity type of the first and second source/drain junction regions. The second active region may have conductivity type different from the conductivity type of the first and second source/drain junction regions.

According to some example embodiments of the inventive concepts, a semiconductor device may include a substrate including a first active region and a second active region, a first group of gate structures on the first active region, wherein the first group of gate structures includes a writing gate structure and a first dummy gate structure that are spaced apart from each other in a first direction, a second group of gate structures on the second active region, wherein the second group of gate structures includes a reading gate structure and a second dummy gate structure that are spaced apart from each other in the first direction, a first source/drain junction region in the first active region between the writing gate structure and the first dummy gate structure, a second source/drain junction region in the second active region between the reading gate structure and the second dummy gate structure, and a connection structure that electrically connects the first source/drain junction region to the second source/drain junction region. The first active region, the first source/drain junction region, and the second source/drain junction region may have a first conductivity type. The second active region may have a second conductivity different from the first conductivity type.

Some example embodiments relate to a semiconductor device including a substrate including a first active region having a first conductivity type and a second active region having a second conductivity type, the first active region being separated from the second active region, at least one writing gate electrode on the first active region, at least one reading gate electrode on the second active region, a first source/drain junction region in the first active region, and a second source/drain junction region in the second active region.

BRIEF DESCRIPTION OF THE DRAWINGS

The accompanying drawings are included to provide a further understanding of the some example embodiments, and are incorporated in and constitute a part of this specification. The drawings illustrate some example embodiments and, together with the description, serve to explain principles thereof. In the drawings.

DETAILED DESCRIPTION

Figure 1A:
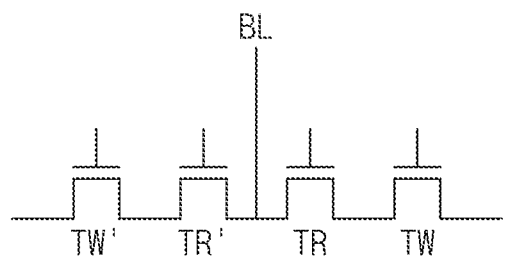
FIGS. 1A and 1B are circuit diagrams illustrating a semiconductor device according to some example embodiments.

These and other features and advantages are described in, or are apparent from, the following detailed description of various example embodiments.

It will be understood that when an element is referred to as being "on," "connected" or "coupled" to another element, it can be directly on, connected or coupled to the other element or intervening elements that may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain some example embodiments of the present description.

Figure 1B:
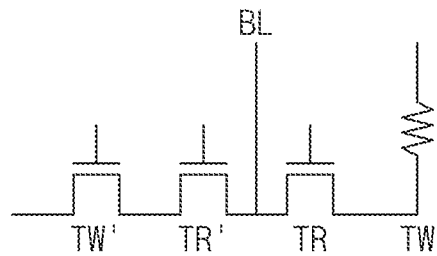

FIGS. 1A and 1B are circuit diagrams illustrating a semiconductor device according to some example embodiments.

Referring to FIG. 1A, a semiconductor device may include a plurality of transistors TW, TW', TR and TR', and a bit line BL. For example, a single bit line BL may be electrically connected to four transistors TW, TW', TR and TR'.

The four transistors TW, TW', TR and TR' may include two writing transistors TW and TW' and tow reading transistors TR and TR'. Each of the writing transistors TW and TW' may also be referred to hereinafter as a first transistor, and each of the reading transistors TR and TR' may also be referred to hereinafter as a second transistor.

The first and second transistors (e.g., TW and TR) adjacent to each other may be configured to store a single bit data. In other words, a single first transistor TW and a single second transistor TR may constitute a single cell. For example, one terminal of the second transistor TR may be connected to the first transistor TW, and the other terminal of the second transistor TR may be connected to the bit line BL.

FIG. 1B is a circuit diagram showing a programmed state of semiconductor device according to some example embodiments. A single bit will be hereinafter described as an example.

Referring to FIG. 1B, a ground state may be placed in the bit line BL and a substrate having the two transistors TR and TW constituting the single cell that are formed thereon, a turn-on voltage (Vturn-on) may be applied to the second transistor TR, and a voltage (Vhigh) greater than the turn-on voltage may be applied to the first transistor TW. For example, the second transistor TR may be applied to about 2V and the first transistor TW may be applied to about 5V.

When the above described voltages are applied, a breakdown may occur in an insulation layer (e.g., an oxide layer) between an active region and a gate included in the first transistor TW to which the high voltage is applied. In this case, the first transistor TW for writing may be changed to have a low resistance state, and a resistance difference of the first transistor TR may store a single bit data in the cell. Consequently, the semiconductor device may include an anti-fuse OTP (one-time programmable) device.

Figure 2:
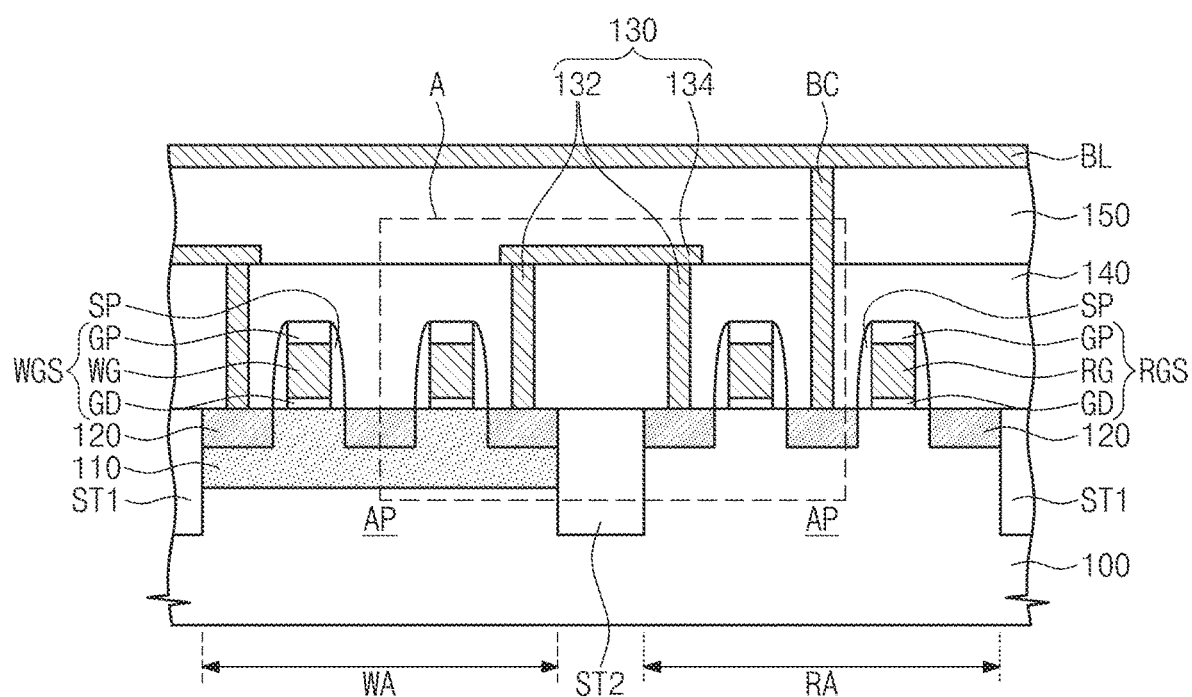
FIG. 2 is a cross-sectional view illustrating the semiconductor device shown in FIG. 1.

FIG. 2 is a cross-sectional view illustrating the semiconductor device shown in FIG. 1. FIGS. 3A through 3D are cross-sectional views corresponding to a portion 'A' of FIG. 2.

Referring to FIG. 2, a substrate 100 including a first area WA and a second area RA may be provided. The first area WA may be a region in which the first transistors TW and TW' of FIGS. 1A and 1B are formed, and the second area RA may be a region in which the second transistors TR and TR' of FIGS. 1A and 1B are formed. The substrate 100 may be a semiconductor substrate. For example, the substrate 100 may include silicon, germanium, or silicon-germanium. Alternatively, the substrate 100 may be a SOI (silicon-on-insulator) substrate. The substrate 100 may be doped with first conductivity type impurities. For example, the first conductivity type may be a p-type.

A plurality of first device isolation layers ST1 may be disposed in the substrate 100 to define a plurality of active regions AP. In addition, at least one second device isolation layer ST2 may be disposed in the substrate 100 to separate the active regions AP of the first and second area WA and RA from each other. The first and second device isolation layers ST1 and ST2 may include silicon oxide. In some example embodiments, the active region AP of the first area WA may be doped with impurities having a second conductivity type (e.g., n-type) that is different from the conductivity type of the substrate 100. Accordingly, at least a portion of the active region AP of the first area WA may have the second conductivity type that is different from the conductivity type of the substrate 100, and the active region AP of the second area RA may have the first conductivity type being the same as the conductivity type of the substrate 100. At least the portion of the active region AP of the first area WA doped with impurities having the second conductivity type may also be referred to hereinafter as a well impurity region 110. In some example embodiments, the well impurity region 110 may have a bottom surface having a level that is higher than the levels of bottom surfaces of the first and second device isolation layers ST1 and ST2, but the example embodiments are not limited thereto. In certain example embodiments, the well impurity region 110 may have the bottom surface having a level that is substantially the same as or lower than the levels of the bottom surfaces of the first and second device isolation layers ST1 and ST2.

A plurality of gate electrodes WG and RG may be disposed respectively on the active regions AP of the first and second areas WA and RA. For example, a pair of gate electrodes WG configured to be used for writing may be provided on the active region AP of the first area WA, and a pair of gate electrodes RG configured to be used for reading may be provided on the active region AP of the second area RA, but the example embodiments are not limited thereto.

The writing gate electrodes WG may be formed of or include a conductive material having a desired, or alternatively predetermined work function, and may contribute to adjust a threshold voltage of the active region AP thereunder. In some example embodiments, each or at least one of the writing gate electrodes WG may include at least one of a metal nitride and a metal. For example, the writing gate electrode WG may include a metal nitride layer and a metal layer, both layers including a material that is different from each other, and are stacked, for example sequentially stacked, one atop the other. The metal nitride may include at least one of, for example, titanium nitride (TiN), tantalum nitride (TaN), titanium aluminum nitride (TiAlN), tantalum aluminum nitride (TaAlN), niobium nitride (NbN), vanadium nitride (VN), and tungsten nitride (WN). The metal layer may include at least one of metals (e.g., aluminum or tungsten) having a resistivity that is less than the resistivity of the metal nitride layer. However, the example embodiments are not limited thereto. Alternatively, each or at least one of the writing gate electrodes WG may include a doped semiconductor (e.g., doped polysilicon).

The reading gate electrodes RG may include a material that is substantially the same as or different from the material of the writing gate electrodes WG. For example, each or at least one of the reading gate electrodes RG may include at least one of a doped semiconductor (e.g., doped polysilicon), metal nitride (e.g., titanium nitride (TiN)), tantalum nitride (TaN), titanium aluminum nitride (TiAlN), tantalum aluminum nitride (TaAlN), niobium nitride (NbN), vanadium nitride (VN), and tungsten nitride (WN)), and metal (e.g., aluminum or tungsten).

Gate insulation patterns GD may be interposed between the active regions AP and the gate electrodes WG and RG. Each of the gate insulation patterns GD may include at least one of, for example, silicon oxide and high-k dielectric material. The high-k dielectric material may include a material having a dielectric constant that is greater than the dielectric constant of silicon oxide. For example, the high-k dielectric material may include hafnium oxide, aluminum oxide, or tantalum oxide.

Figure 3A:
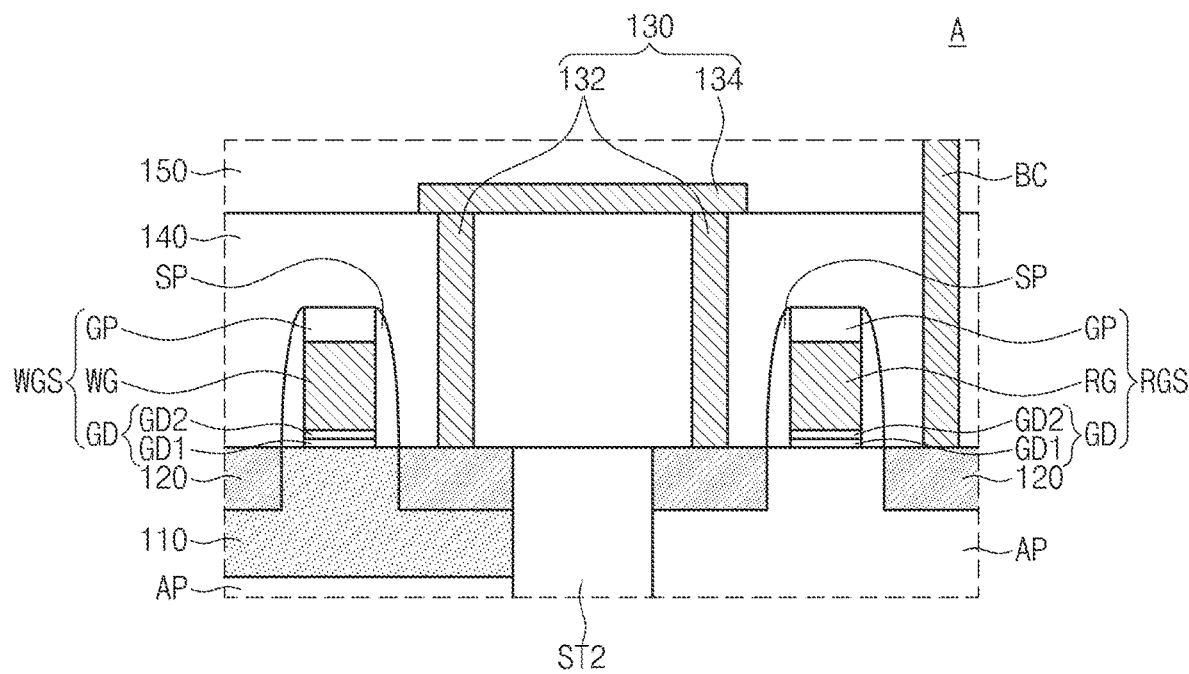
FIGS. 3A through 3D are cross-sectional views corresponding to a portion 'A' of FIG. 2.

In some example embodiments, as can be seen in FIG. 3A, each or at least one of the gate insulation patterns GD may include a first gate insulation layer GD1 and a second gate insulation layer GD2 that are sequentially stacked one atop the other. The first gate insulation layer GD1 may include a silicon oxide layer, and the second gate insulation layer GD2 may include a high-k dielectric layer including the high-k dielectric material described above. Gate capping patterns GP may be disposed on top surfaces of the gate electrodes WG and RG. Each or at least one of the gate capping patterns GP may include at least one of a silicon oxide layer, a silicon nitride layer, and a silicon oxynitride layer. Hereinafter, a writing gate structure WGS may be defined by the gate insulation pattern GD, the writing gate electrode WG, and the gate capping pattern GP that are sequentially stacked on one another on the active region AP of the first area WA, and a reading gate structure RGS may be defined by the gate insulation pattern GD, the reading gate electrode RG, and the gate capping pattern GP that are sequentially stacked on the active region AP of the second area RA.

In some example embodiments, the gate structures WGS and RGS may be formed by forming and patterning a gate insulation layer, a gate electrode layer, and a gate capping layer that are sequentially stacked on the substrate 100, but the example embodiments are not limited thereto. Gate spacers SP may be disposed on sidewalls of each of the gate structures WGS and RGS. The gate spacers SP may include at least one of a silicon oxide layer, a silicon oxynitride layer, and a silicon nitride layer.

Source/drain junction regions 120 may be provided respectively in or on the active regions AP of the first and second area WA and RA. For example, the source/drain junction regions 120 of the first area WA may be provided in the active regions AP between the pair of writing gate electrodes WG and in the active regions AP of both sides of the pair of writing gate electrodes WG. The source/drain junction regions 120 of the first area WA may be provided in the well impurity region 110. The source/drain junction region 120 of the second area RA may be provided in the active region AP between the pair of reading gate electrodes RG and in the active region AP of both sides of the pair of reading gate electrodes RG. The source/drain junction regions 120 may be formed to have a second conductivity type that is different from the conductivity type of the substrate 100. The source/drain junction regions 120 may have bottom surfaces having levels that are higher than the levels of the bottom surface of the well impurity region 110.

In some example embodiments, the source/drain junction regions 120 may be a portion of the substrate 100. For example, the source/drain junction regions 120 may be formed by injecting impurities having the second conductivity type (e.g., n-type) into the active regions AP of both sides of the gate electrodes WG and RG. Alternatively, the source/drain junction regions 120 may be epitaxial patterns formed through an epitaxial growth process. For example, the formation of the source/drain junction regions 120 may include forming recess regions in the active regions AP of both sides of the gate electrodes WG and RG, and performing the epitaxial growth process to form epitaxial layer in the recess regions. In this case, the source/drain junction regions 120 may include Si or SiC, and may protrude over a top surface of the substrate 100. Impurities having the second conductivity type may be injected into the source/drain junction regions 120 contemporaneously or after the epitaxial growth process. The source/drain junction regions 120 may serve as source/drain of transistor.

Connection structure 130 may be disposed on the substrate 100. The connection structure 130 may electrically connect the source/drain junction region 120 at one side of the writing gate electrode WG to the source/drain junction region 120 at one side of the reading gate electrode RG adjacent to the writing gate electrodes WG. In other words, the connection structure 130 may connects the source/drain junction regions 120 which are adjacent to each other with the second device isolation layer ST2 interposed therebetween. For example, the connection structure 130 may include a pair of source/drain contacts 132 and a connecting conductive line 134 that electrically connects the pair of source/drain contacts 132 to each other. The pair of source/drain contacts 132 may be connected to the adjacent source/drain junction regions 120 of the first and second areas WA and RA, respectively, and the connecting conductive line 134 may be commonly connected to the pair of source/drain contacts 132. The source/drain contacts 132 may be provided in a first interlayer dielectric layer 140, and the connecting conductive line 134 may be provided on the first interlayer dielectric layer 140. The source/drain contacts 132 may have top surfaces having levels that are substantially the same as the levels of a top surface of the first interlayer dielectric layer 140. The first interlayer dielectric layer 140 may include at least one of, for example, a silicon oxide layer, a silicon nitride layer, and a silicon oxynitride layer. Each or at least one of the source/drain contacts 132 and the connecting conductive line 134 may include at least one of semiconductor, metal, metal silicide, and conductive metal nitride.

A second interlayer dielectric layer 150 may be disposed on the first interlayer dielectric layer 140, and a bit line BL may be disposed on the second interlayer dielectric layer 150. A bit line contact BC may be provided to electrically connect the bit line BL to the source/drain junction region 120 between the pair of reading gate electrodes RG. As such, the source/drain junction region 120 at one side of the reading gate electrode RG may be connected to the source/drain contact 132, and the source/drain junction region 120 at other side of the reading gate electrode RG may be connected to the bit line contact BC. The second interlayer dielectric layer 150 may include at least one of, for example, a silicon oxide layer, a silicon nitride layer, and a silicon oxynitride layer. The bit line contact BC may include a material that is substantially the same as the material of the source/drain contacts 132 or the connecting conductive line 134. For example, the bit line contact BC may include at least one of a doped semiconductor, a metal, a metal silicide, and a conductive metal nitride. The bit line BL may include a metallic material such as aluminum, tungsten, or copper.

Figure 3B:
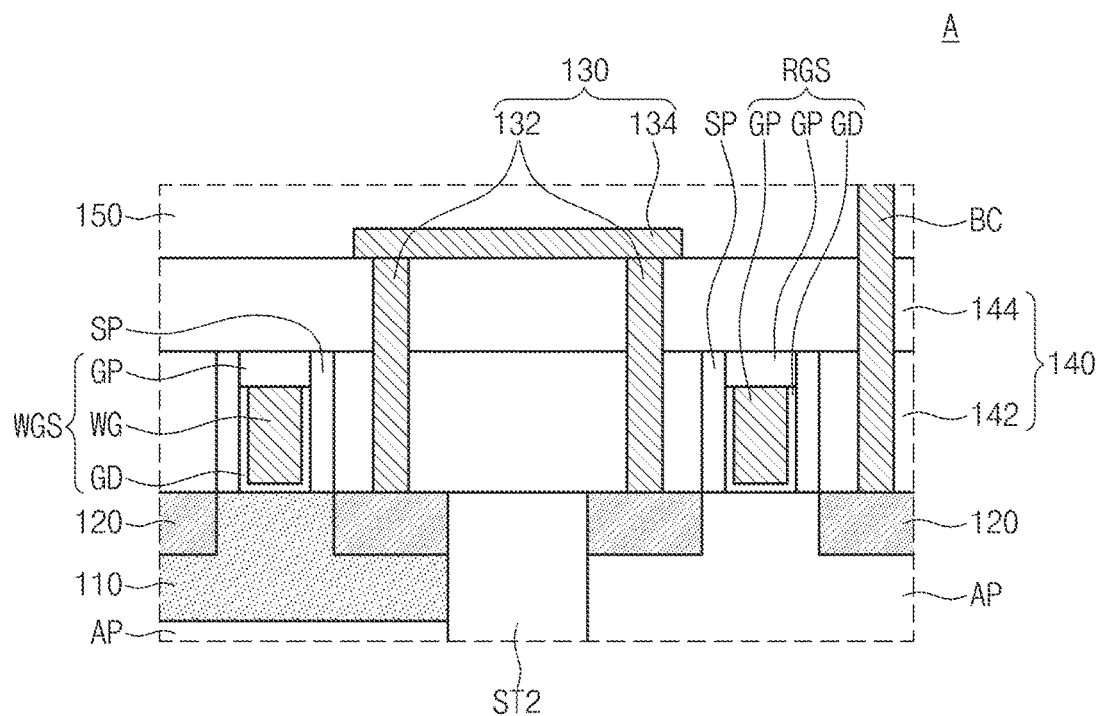

The gate structures WGS and RGS may be formed by a gate last process as illustrated in FIG. 3B. For example, the formation of the gate structures WGS and RGS may include forming sacrificial gate patterns (not shown) on the active portions AP, forming the gate spacers SP on opposite sidewalls of each of the sacrificial gate patterns, forming a first sub-interlayer dielectric layer 142 that covers the gate spacers SP and expose top surfaces of the sacrificial gate patterns, removing the sacrificial gate patterns to form gap regions exposing the active regions AP between the gate spacers SP, and sequentially forming the gate insulation patterns GD, the gate electrodes WG and RG, and the gate capping patterns GP in the gap regions. In this case, the source/drain junction regions 120 may be formed after forming the gate spacers SP and before forming the first sub-interlayer dielectric layer 142. In addition, a second sub-interlayer dielectric layer 144 may be formed on the first sub-interlayer dielectric layer 142 so as to cover top surfaces of the gate electrodes WGS and RGS. A combination of the first and second sub-interlayer dielectric layer 142 and 144 may correspond to the first interlayer dielectric layer 140 described with reference to FIG. 2. In some example embodiments of FIG. 3B, the gate insulation patterns GD may cover bottom and side surfaces of the gate electrodes WG and RG.

Figure 3C:
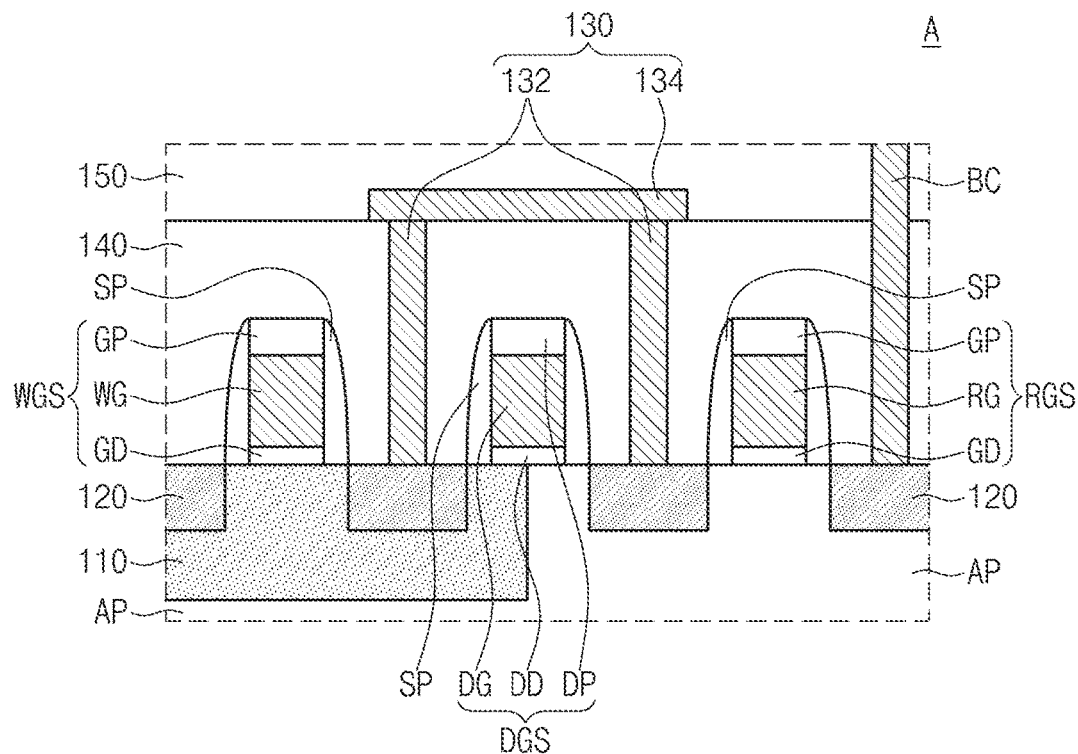

In some example embodiments, the second device isolation layer ST2 may be omitted as illustrated in FIG. 3C. For example, the active portion AP of the first area WA may be unified with the second active region AP of the second area RA to constitute a unitary (single) layer. In addition, a dummy gate structure DGS may be disposed on the substrate 100 between the first area WA and the second area RA. That is, the dummy gate structure DGS may be disposed between the writing gate electrode structure WGS and the reading gate structure RGS adjacent to each other. The dummy gate structure DGS may be formed to have substantially the same structural features as the writing gate structure WGS or the reading gate structure RGS described with reference to FIG. 2. For example, the dummy gate structure DGS may include a dummy insulation pattern DD, a dummy gate electrode DG, and a dummy capping pattern DP that are sequentially stacked on one another on the substrate 100. The dummy insulation pattern DD, the dummy gate electrode DG, and the dummy capping pattern DP may be formed by substantially the same processes and materials as for the gate insulation pattern GD, the writing or reading gate electrode WG or RG, and the gate capping pattern GP, respectively. The well impurity region 110 may be formed to overlap the writing gate electrodes WG and the source/drain junction regions 120 of the first area WA, but not to overlap the reading gate electrodes RG and the source/drain junction regions 120 in the second area RA. For example, the well impurity region 110 may have a vertical boundary positioned on, or slightly off, an imaginary vertical line crossing a center of the dummy gate structure DGS. The connection structure 130 may connect the adjacent source/drain junction regions 120 of the first and second areas WA and RA with the dummy gate structure DGS interposed therebetween.

The writing gate electrodes WG and the source/drain junction regions 120 of the first area WA may constitute the first transistors TW and TW' of FIGS. 1A and 1B, and the reading gate electrodes RG and the source/drain junction regions 120 of the second area RA may constitute the second transistors TR and TR' of FIGS. 1A and 1B. A first single transistor and a second single transistor connected to each other by the connection structure 130 may constitute a single unit cell for storing a single bit data.

The semiconductor device according to some example embodiments may include a plurality of unit cells described above, and at least one of the unit cells may have the first transistor in a blown state. Herein, the phrase "the first transistor in a blown state" may be defined as the first transistor being under a condition where the gate insulation pattern GD below the writing gate electrode WG has a destroyed insulated state by a high voltage (i.e., a dielectric breakdown phenomenon may occur in the gate insulation pattern GD between the active region AP and the writing gate electrode WG are subjected to the high voltage). The first transistor in a blown state may serve as a resistor having low resistance, and the first transistor in an unblown state may serve as a resistor having high resistance. Once a bit line voltage has been applied to the bit line BL, a level of read current flowing through the bit line BL may be changed depending on whether the resistance of the first transistor is high or low, and thus the difference of current value may be sensed to read the bit data stored in the unit cell.

According to some example embodiments, the active region AP under the writing gate electrode WG may have a conductivity type that is different from the substrate 100. Accordingly, the first transistor (i.e., the writing gate electrode WG, the well impurity region 110, and the source/drain junction regions 120) may operate substantially the same way as a deletion-mode transistor. This configuration may make it possible to reduce a gate leakage current occurring between the writing gate electrode WG and the active region AP thereunder. As such, non-linearity of the read current with respect to the bit line current may be alleviated, and thus the semiconductor device may have improved characteristics.

Figure 3D:
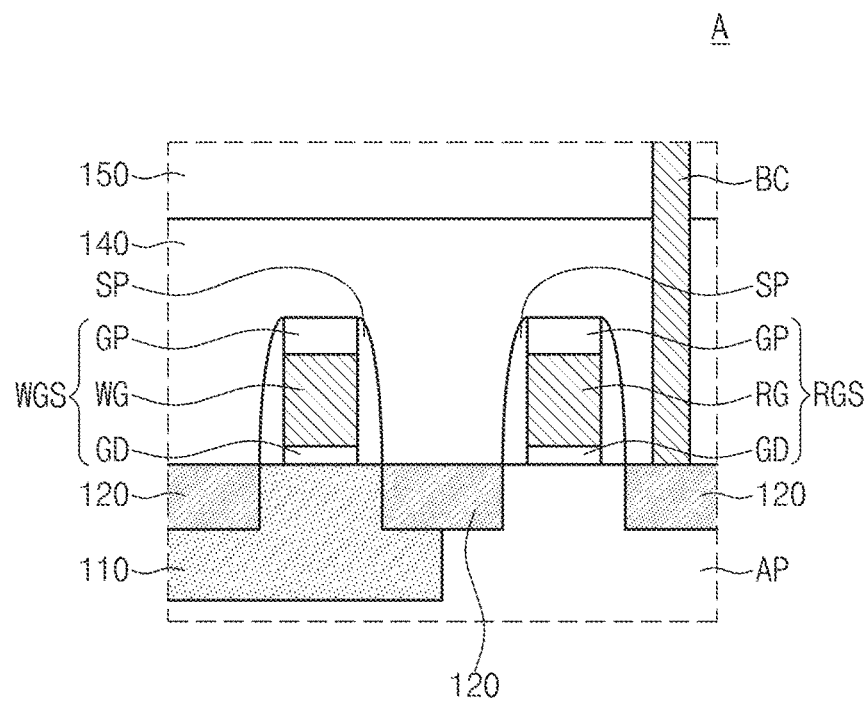

To achieve the reduction of the cell area, as shown in FIG. 3D, the writing gate electrode WG and the reading gate electrode RG constituting the single unit cell may be formed to share the source/drain junction region 120 therebetween. In this case, it is needed that the well impurity region 110 may be formed to overlap with the writing gate electrodes WG, but not with the reading gate electrodes RG. For example, the well impurity region 110 may be formed to have a vertical boundary overlapping with the source/drain junction region 120 between the writing gate electrode WG and the reading gate electrode RG. However, the pitch between the gate electrodes is gradually reduced due to high integration of the semiconductor device, it is increasingly difficult to form the well impurity region 110 having the above-mentioned configuration. For example, the well impurity region 110 may be formed to be positioned not only under the writing gate electrode WG but also under the reading gate electrode RG adjacent thereto. In other words, the example embodiment of FIG. 3D may lead to a reduced fabrication margin, a fallen mass production, and/or a poor distribution of chip characteristics.

According to some example embodiments, the writing gate electrode WG and the reading gate electrode RG adjacent thereto may be formed not to share the source/drain junction region 110 therebetween. For example, as can be seen in FIG. 2, the device isolation layer ST2 may be formed to separate the active region AP on which the writing gate electrode WG from the active region AP on which the reading gate electrode RG is located. Alternatively, as shown in FIG. 3C, the dummy gate structure DGS may be formed to increase an interval between the writing gate electrode WG and the reading gate electrode RG. It therefore may be easy to form the well impurity region 110 overlapping the writing gate electrode WG but not overlapping the reading gate electrode RG. As a result, the example embodiments may acquire an increased fabrication margin and/or a good distribution of chip characteristics.

Transistors having planar gate structures have been described with reference to FIGS. 2, 3A and 3C, but the example embodiments are not limited thereto. In certain example embodiments, the semiconductor device may include transistors having gate structures that are substantially identical or similar to the gate structures of FinFET device, which will be described below with reference to accompanying figures.

Figure 4:
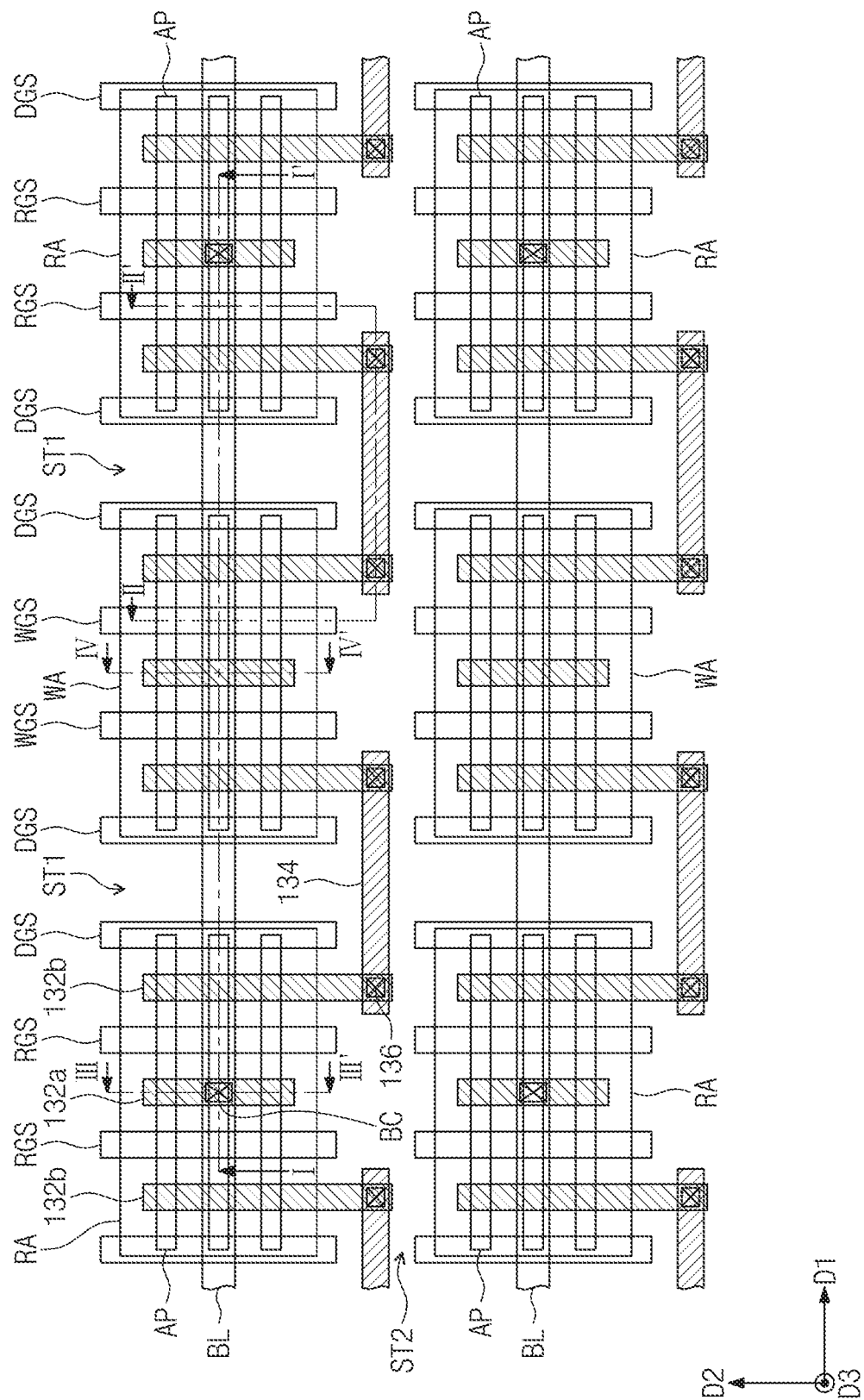
FIG. 4 is a plan view illustrating a semiconductor device according to some example embodiments.
Figure 5:
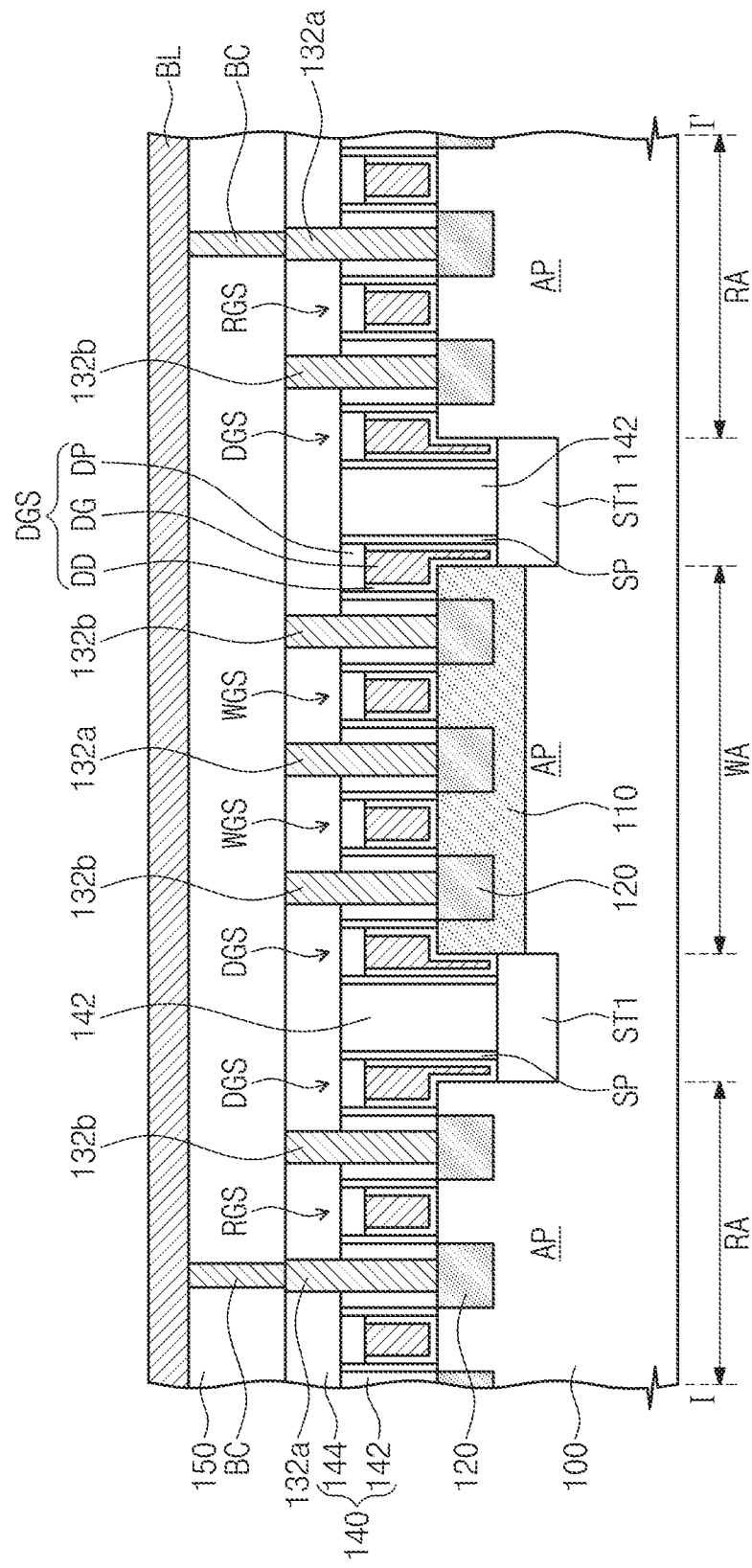
FIGS. 5 and 6 are cross-sectional views taken along lines I-I' and II-II' of FIG. 4, respectively.
Figure 6:
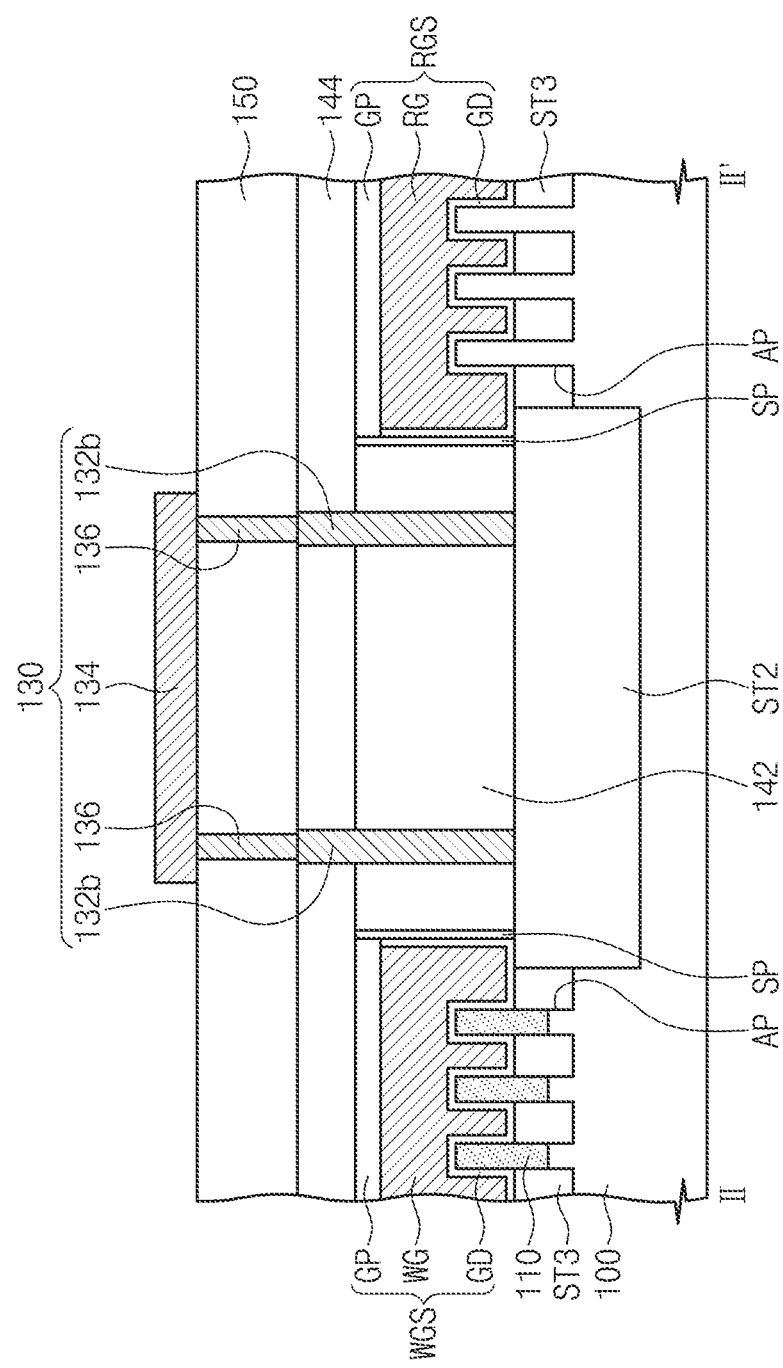
Figure 7:
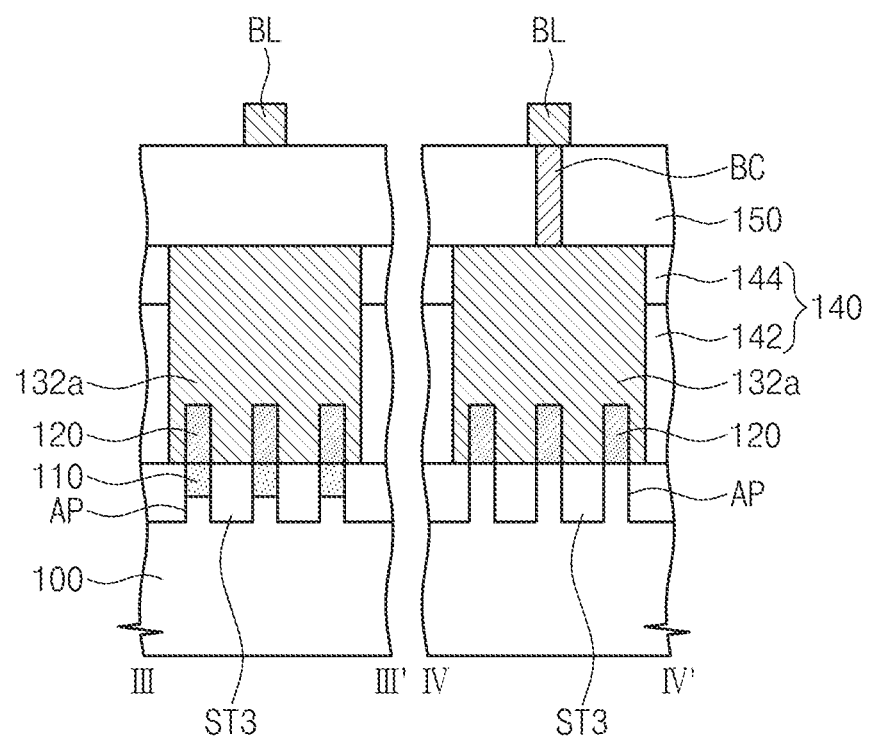
FIG. 7 is a cross-sectional view taken along lines III-III' and IV-IV' of FIG. 4.

FIG. 4 is a plan view illustrating a semiconductor device according to some example embodiments of the inventive concepts. FIGS. 5 and 6 are cross-sectional views taken along lines I-I' and II-II' of FIG. 4, respectively. FIG. 7 is a cross-sectional view taken along lines III-III' and IV-IV' of FIG. 4.

Referring to FIGS. 4 through 7, a substrate 100 including a plurality of first areas WA and a second areas RA may be provided. As described in FIG. 2, the first areas WA may correspond to regions on which first transistors for writing are formed, and the second areas RA may correspond to regions on which second transistors for reading are formed. The first areas WA and the second areas RA may be two-dimensionally arranged to constitute a plurality of rows and columns, in plan view. For example, the first and second areas WA and RA may be alternatingly and repeatedly arranged in a first direction D1 to constitute a single row. The first areas WA may be arranged in a second direction D2 to constitute a first column, and the second areas RA may be arranged in the second direction D2 to constitute a second column. The first column and the second column may be adjacent to each other. The substrate 100 may have a first conductivity type (e.g., a p-type).

Device isolation layers ST1 and ST2 may be disposed in the substrate 100 between the first and second areas WA and RA. For example, a first device isolation layer ST1 may be disposed in the substrate 100 between the first area WA and the second area RA adjacent to each other in the first direction D1, and a second device isolation layer ST2 may be disposed in the substrate 100 between the first areas WA adjacent to each other in the second direction D2 or between the second areas RA adjacent to each other in the second direction D2. The first and second device isolation layers ST1 and ST2 may separate the first and second areas WA and RA from each other. The first and second device isolation layers ST1 and ST2 may be connected to each other, thereby constituting a single continuous body. It should be understood that the single body is continuous, or substantially continuous to account for manufacturing tolerances. The first and second device isolation layers ST1 and ST2 may include, for example, a silicon oxide layer.

Active regions AP may be respectively disposed in the substrate 100 of the first and second areas WA and RA. The active regions AP of each of the first and second areas WA and RA may extend in the first direction D1 and may be arranged to be spaced apart from each other in the second direction D2. Each of the active regions AP may have a fin shape protruding along a third direction D3 perpendicular to the first and second directions D1 and D2. The active regions AP of the first area WA may be spaced apart from the active region AP of the second area RA, but the example embodiment are not limited thereto. In some example embodiments, the active regions AP may be a portion of the substrate 100. In this case, the active regions AP may be formed by patterning the substrate 100. Alternatively, the active regions AP may be epitaxial patterns formed on the substrate 100.

Upper portions of the active regions AP of the first areas WA may be doped with impurities having a second conductivity type (e.g., an n-type) that is different from the first conductivity type. The active region AP of the first area WA doped with impurities having the second conductivity type may also be referred to hereinafter as a well impurity region 110. The active regions AP of the second areas RA may have the same conductivity type (i.e., the first conductivity type) as the substrate 100. Although the show three active regions AP on the substrate 100, the example embodiments are not limited thereto.

Third device isolation layers ST3 may be disposed on the substrate 100 at both sides of the active regions AP. The third device isolation layers ST3 may expose top surfaces of the active regions AP. Each of the first to third device isolation layers ST1, ST2 and ST3 may have a depth extending in a direction perpendicular to a top surface of the substrate 100. In some example embodiments, the third device isolation layers ST3 may have depths that are less than the depths of the first and second device isolation layers ST1 and ST2, and greater than the depths of the well impurity regions 110. In other words, the third device isolation layers ST3 may have bottom surfaces that are higher than the surfaces of the first and second device isolation layers ST1 and ST2, and lower than the surfaces of the well impurity regions 110. The first to third device isolation layers ST1, ST2 and ST3 each may have a top surface that is substantially coplanar with one another, but the example embodiments are not limited thereto.

A pair of writing gate structures WGS may be disposed to cross the active regions AP on the substrate 100 of each of the first areas WA, and a pair of reading gate structures RGS may be disposed to cross the active regions AP on the substrate 100 of each of the second areas RA. The writing gate structures WGS may extend in the second direction D2 and cover top and side surfaces of the upper portions of the active regions AP of the first area WA. The writing gate structures WGS of the first areas WA adjacent to each other in the second direction D2 may be spaced apart from each other in the second direction D2. Likewise, the reading gate structures RGS may extend in the second direction D2 and cover top and side surfaces of the upper portions of the active regions AP of the second area RA. The reading gate structures RGS of the second areas RA adjacent to each other in the second direction D2 may be spaced apart from each other in the second direction D2.

Each of the writing gate structures WGS may include a gate insulation pattern GD, a writing gate electrode WG, and a gate capping pattern GP that are sequentially stacked on the substrate 100. The gate insulation pattern GD, the writing gate electrode WG, and the gate capping pattern GP may include substantially the same materials as the materials described with reference to FIG. 2. For example, the gate insulation pattern GD may include at least one of silicon oxide and silicon nitride. In some example embodiments, as those described with reference to FIG. 3a, the gate insulation pattern GD may include a first gate insulation layer GD1 and a second gate insulation layer GD2 that are stacked one atop the other. The first gate insulation layer GD1 may include a silicon oxide layer, and the second gate insulation layer GD2 may include a high-k dielectric layer. In some example embodiments, the gate insulation pattern GD may be disposed not only between the writing gate electrode WG and the active region AP but also between the writing gate electrode WG and gate spacers SP which will be described later. The writing gate electrode WG may include at least one of semiconductor, metal, and conductive metal nitride. The gate capping pattern GP may include at least one of a silicon oxide layer, a silicon nitride layer, and a silicon oxynitride layer.

Each of the reading gate structures RGS may include a gate insulation pattern GD, a writing gate electrode WG, and a gate capping pattern GP that are sequentially stacked on the substrate 100. The gate insulation pattern GD, the writing gate electrode WG, and the gate capping pattern GP may include substantially the same materials and structures as those of the writing gate structures WGS. The reading gate electrode RG may include a material that is substantially the same as or different from the material of the writing gate electrode WG. For example, the reading gate electrode RG may include at least one of a doped semiconductor, a metal, and a conductive metal nitride. The writing and reading gate structures WGS and RGS may include a structure formed by a gate last process, but the some example embodiments are not limited thereto.

In some example embodiments, a pair of dummy gate structures DGS may be disposed between the writing gate electrode structure WGS and the reading gate structure RGS adjacent to each other. Each of the dummy gate structures DGS may include a dummy insulation pattern DD, a dummy gate electrode DG, and a dummy capping pattern DP. The dummy insulation pattern DD, the dummy gate electrode DG, and the dummy capping pattern DP may be formed by substantially the same processes and materials as the processes and materials of the writing or reading gate structure WGS or RGS (i.e., the gate insulation pattern GD, the writing or reading gate electrode WG or RG, and the gate capping pattern GP). The gate structures WGS, RGS and DGS may be formed to have a regular pitch. For example, the gate structures WGS, RGS and DGS may have substantially the same widths, and/or be spaced apart from one another in the first direction D1 at the same intervals.

As viewed in plan view, each of the dummy gate structures DGS may partially overlap the first device isolation layer ST1. For example, a portion of each or at least one dummy gate structure DGS may cross ends of the active regions AP adjacent thereto and the third device isolation layer ST3, and an other portion of each dummy gate structure DGS may cross the first device isolation layer ST1. In addition, each or at least one of the dummy gate structures DGS may extend downward along a sidewall of the active region AP adjacent to the first device isolation layer ST1 and may be in contact with the top surface of the first device isolation layer ST1. That is, the dummy gate structure DGS may have a stair-stepped bottom surface including a higher bottom surface in contact with the top surface of the active region AP and a lower bottom surface in contact with the top surface of the first device isolation layer ST1. However, the example embodiments are not limited thereto.

In some example embodiments, one single dummy gate structure DGS may be provided between the writing gate electrode structure WGS and the reading gate structure RGS adjacent to each other. In this case, the dummy gate structure DGS may lie on the first device isolation layer ST1. As such, the dummy gate structure DGS may completely overlap with the first device isolation layer ST1.

Gate spacers SP may be disposed on sidewalls of the gate structures WGS and RGS. The gate spacers SP may include at least one of a silicon oxide layer, a silicon oxynitride layer, and a silicon nitride layer.

Source/drain junction regions 120 may be provided respectively in or on the active regions AP of the first and second area WA and RA. For example, the source/drain junction regions 120 of the first area WA may be provided in the active regions AP (i.e., well impurity region 110) between the pair of writing gate structures WGS and between the writing gate structures WGS and the dummy gate structures DGS that are adjacent to each other. The source/drain junction region 120 of the second area RA may be provided in the active region AP between the pair of reading gate structures RGS and between the reading gate structures RGS and the dummy gate structures DGS adjacent to each other. The source/drain junction regions 120 may be formed to have the second conductivity type different from the conductivity type of the substrate 100. The source/drain junction regions 120 may have bottom surfaces having levels that are higher than the level of the bottom surface of the well impurity region 110. The source/drain junction regions 120 may serve as a source/drain region of transistor.

In some example embodiments, the source/drain junction regions 120 each may be a portion of the substrate 100 formed by an implant process where impurities having a second conductivity type (i.e., n-type) are injected into the active regions AP, or an epitaxial pattern formed by an epitaxial growth process. In case the source/drain junction regions 120 are the epitaxial patterns, the source/drain junction regions 120 may protrude over the top surface of the substrate 100. In addition, the impurities having the second conductivity type may be injected into the source/drain junction regions 120 at the same time with or after the epitaxial growth process.

The writing gate electrodes WG and the source/drain junction regions 120 of the first area WA may constitute the first transistors TW and TW' of FIGS. 1A and 1B, and the reading gate electrodes RG and the source/drain junction regions 120 of the second area RA may constitute the second transistors TR and TR' of FIGS. 1A and 1B.

Source/drain contacts 132a and 132b may be disposed between the gate structures WGS, RGS and DSG. The source/drain contacts 132a and 132b may include first source/drain contacts 132a between the pair of writing gate structures WGS and between the pair of reading gate structures RGS, and second source/drain contacts 132b between the writing gate structure WGS and the dummy gate structure DGS adjacent to each other and between the reading gate structure RGS and the dummy gate structure DGS adjacent to each other. The source/drain contacts 132a and 132b may be electrically connected to at least one of the source/drain junction regions 120. In some example embodiments, each of the source/drain contacts 132a and 132b may be disposed at one side of the writing or reading gate structure WGS or RGS and be commonly connected to the source/drain junction regions 120 arranged in the second direction D2. As viewed in plan view, the source/drain contacts 132a and 132b may extend in the second direction D2 to have bar shapes that cross the active regions AP of the first area WA or the second area RA.

The second source/drain contacts 132b may extend onto the second device isolation layer ST2. The second source/drain contacts 132b of the first and second areas WA and RA adjacent to each other may be commonly connected to a connecting conductive line 134 through corresponding connecting contacts 136. As such, the source/drain junction regions 120 at one side of the writing and reading gate electrodes WG and RG adjacent to each other in the first direction D1 may be reciprocally connected to each other through the second source/drain contacts 132b, the connecting contacts 136, and the connecting conductive line 134.

Each of the source/drain contacts 132a and 132b, the connecting contacts 136, and the connecting conductive line 134 may include at least one of a doped semiconductor, a metal, a metal silicide, and a conductive metal nitride. The second source/drain contacts 132b, the connecting contacts 136, and the connecting conductive line 134 may be combined to constitute the connection structure 130. As a result, the connection structure 130 may connect one end of the first transistor to one end of the second transistor adjacent to the first transistor.

The source/drain contacts 132a and 132b may be provided in a first interlayer dielectric layer 140. The first interlayer dielectric layer 140 may include a first sub-interlayer dielectric layer 142 that covers the gate spacers SP and exposes top surfaces of the gate structures WGS, RGS and DGS and a second sub-interlayer dielectric layer 144 that is disposed on the first sub-interlayer dielectric layer 142 and covers the top surfaces of the gate structures WGS, RGS and DGS. The source/drain contacts 132a and 132b may have top surfaces that are substantially coplanar with the surfaces of the first sub-interlayer dielectric layer 142. Each of the first and second sub-interlayer dielectric layers 142 and 144 may include at least one of a silicon oxide layer, a silicon nitride layer, and a silicon oxynitride layer.

A second interlayer dielectric layer 150 may be provided on the first interlayer dielectric layer 140. The second interlayer dielectric layer 150 may include at least one of, for example, a silicon oxide layer, a silicon nitride layer, and a silicon oxynitride layer. For example, the connecting contacts 136 may be disposed in the second interlayer dielectric layer 150, and the connecting conductive line 134 may be disposed on the second interlayer dielectric layer 150.

In some example embodiments, the connecting contacts 136 may be omitted. In this case, the connecting conductive line 134 may be provided between the first interlayer dielectric layer 140 and the second interlayer dielectric layer 150, and the second source/drain contacts 132b of the first and second areas WA and RA adjacent to each other may be directly connected to the connecting conductive line 134.

A bit line BL may be disposed on the second interlayer dielectric layer 150. A bit line contact BC may be provided in the second interlayer dielectric layer 150 to electrically connect the bit line BL to the first source/drain contact 132a between the pair of reading gate structures RGS. As such, the bit line contact BC and the first source/drain contact 132a may electrically connect the bit line BL to the source/drain junction regions 120 between the pair of reading gate electrodes RG. The bit line contact BC may include a material that is substantially the same as the materials of the source/drain contacts 132a and 132b, the connecting contacts 136, or the connecting conductive line 134. The bit line BL may include a metal such as aluminum, tungsten, or copper. In some example embodiments, the connecting conductive line 134 may be disposed on the same level (i.e., on a top surface of the second interlayer dielectric layer 150) as the level of the bit line BL, and may be formed of or include the same material as the material of the bit line BL.

Figure 8:
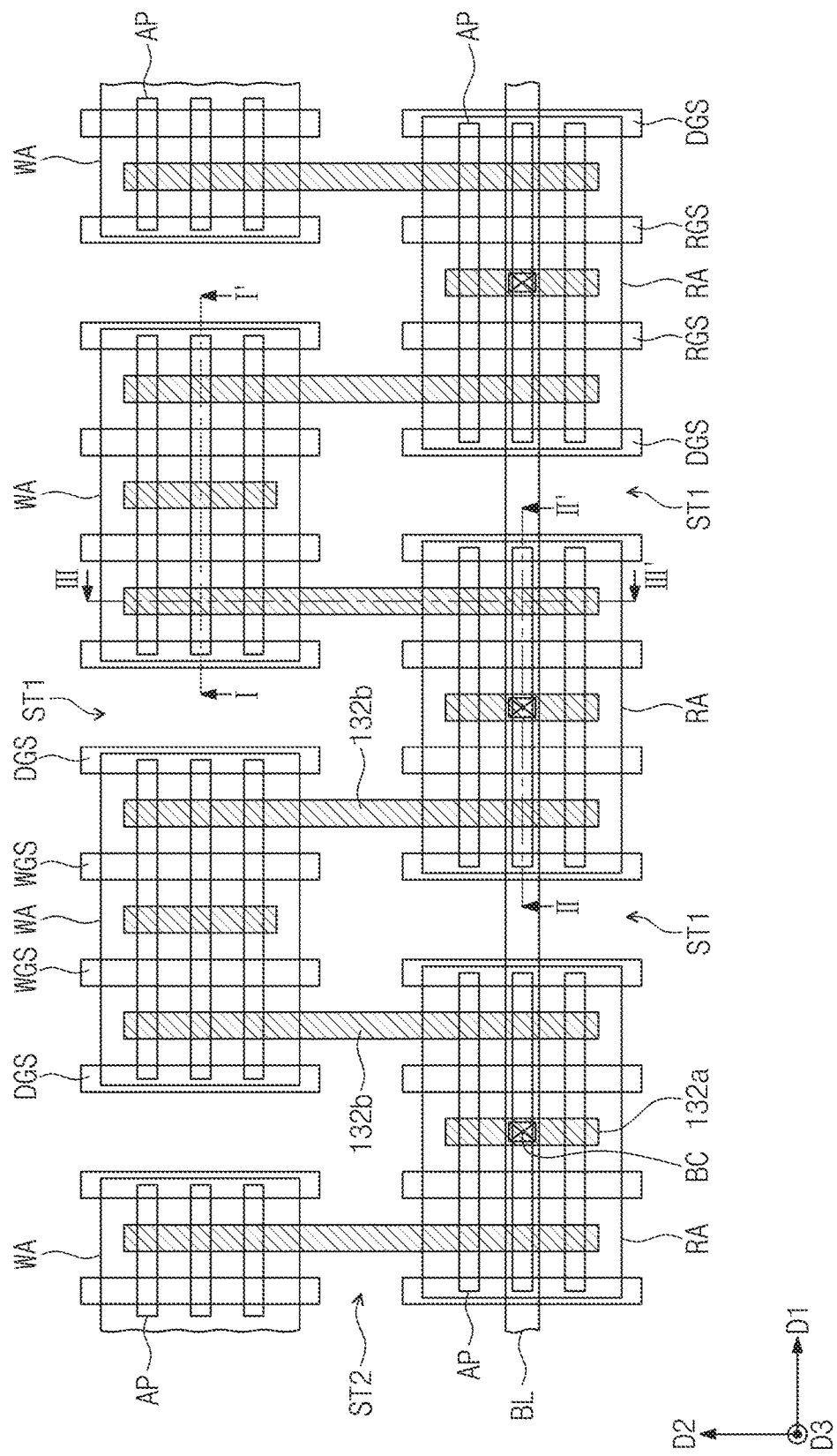
FIG. 8 is a plan view illustrating a semiconductor device according to some example embodiments.
Figure 9:
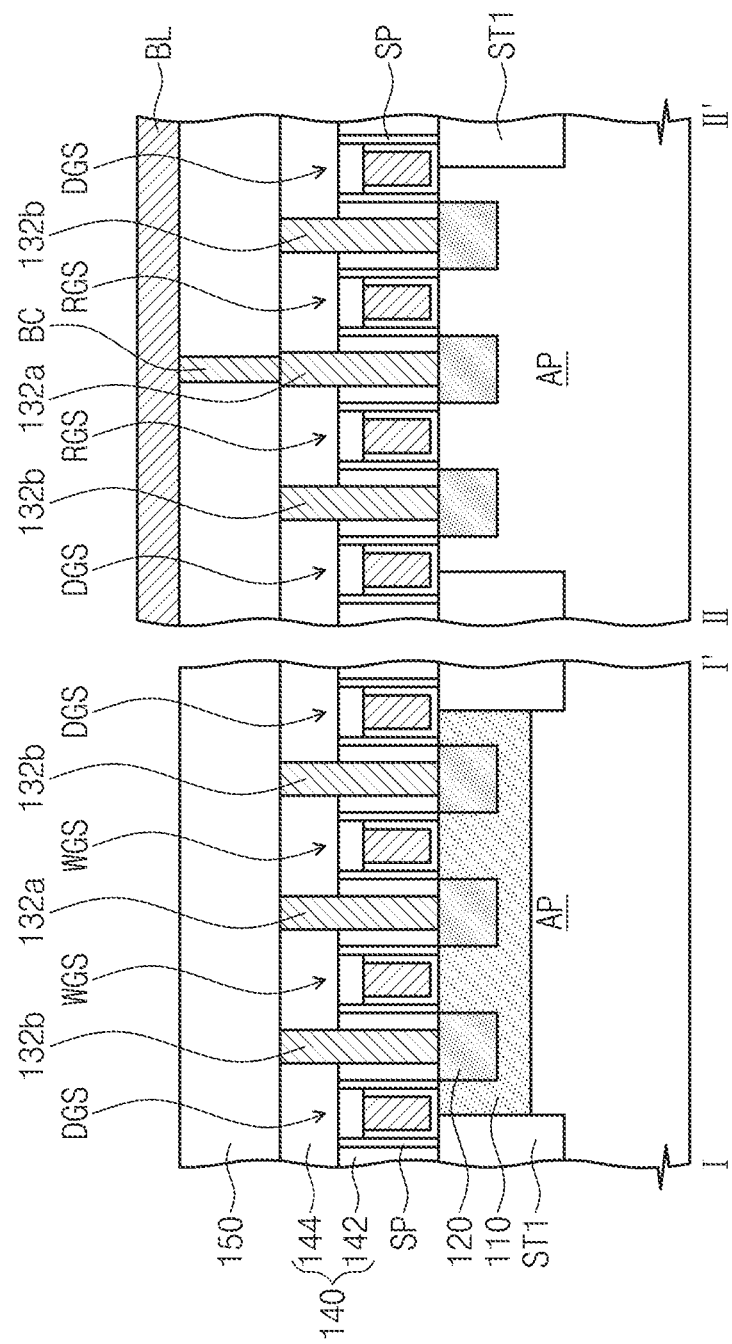
FIG. 9 is a cross-sectional view taken along lines I-I' and II-II' of FIG. 8.
Figure 10:
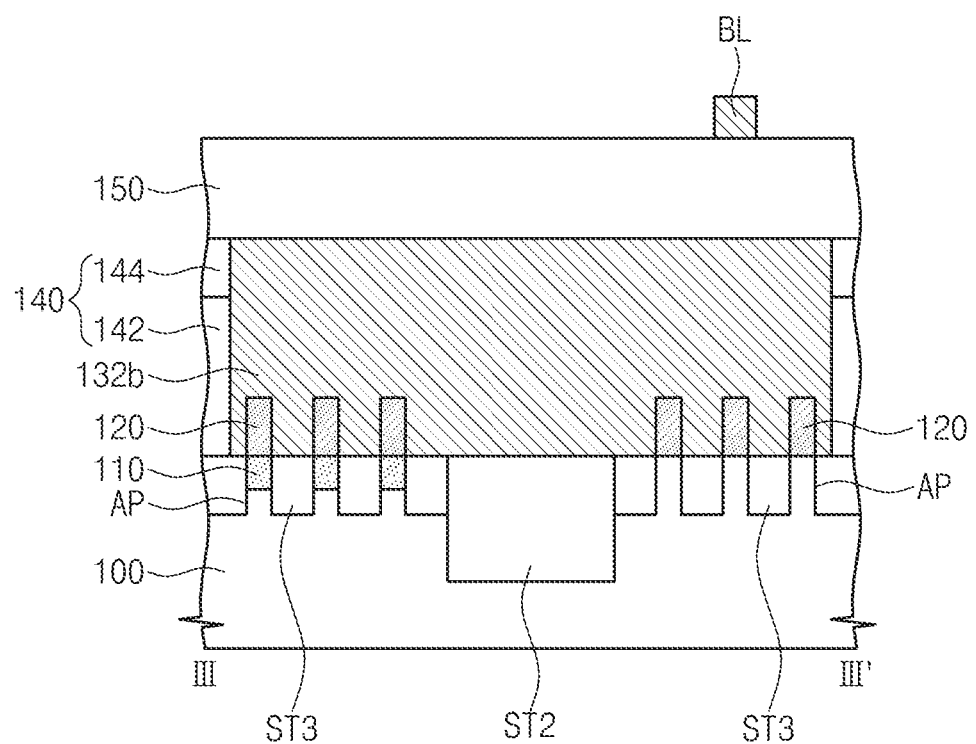
FIG. 10 is a cross-sectional view taken along lines III-III' and IV-IV' of FIG. 8.

FIG. 8 is a plan view illustrating a semiconductor device according to some example embodiments of the present inventive concepts. FIG. 9 is a cross-sectional view taken along lines I-I' and II-II' of FIG. 8. FIG. 10 is a cross-sectional view taken along lines III-III' and IV-IV' of FIG. 8. In the description that follows, the description of features that are the same as those in the above-mentioned example embodiments will be omitted for brevity and the description of features that are different from those in FIGS. 4 through 7 will be mainly explained below.

Referring to FIGS. 8 through 10, the substrate 100 may include a plurality of first areas WA and a plurality of second areas RA. As viewed in plan view, the plurality of first areas WA may be arranged in the first direction D1 to constitute a first row, and the plurality of second areas RA may be arranged in the first direction D1 to constitute a second row. The first row and the second row may be spaced apart from each other in the second direction D2. In some example embodiments, the first areas WA and the second areas RA respectively included in the adjacent first and second rows may be arranged in an alternating pattern (zigzag) in the first direction D1. In other words, the second areas RA of the second row may be shifted at regular intervals (e.g., a distance twice the pitch of the gate structures WGS, RGS and DGS) in the first direction D1 from the first areas WA of the first row. The first device isolation layer ST1 and/or the second isolation layer ST2 may be disposed in the substrate 100 between the first areas WA and the second areas RA.

The first area WA may include the active regions AP each having a fin shape that protrudes from the substrate 100, the pair of writing gate structures WGS that cross the active regions AP, and the source/drain junction regions 120 positioned at both sides of the writing gate structures WGS, as described with reference to FIGS. 4 through 7. The active regions AP of the first area WA may have the upper portions (i.e., the well impurity regions 110) doped with impurities having the same second conductivity type as the conductivity type of the source/drain junction regions 120. The pair of dummy gate structures DGS may be disposed between the writing gate structures WGS adjacent to each other in the first direction D1.

The second area RA may include the active regions AP each having a fin shape that protrudes from the substrate 100, the pair of reading gate structures RGS that cross the active regions AP, and the source/drain junction regions 120 positioned at both sides of the reading gate structures RGS, as described with reference to FIGS. 4 through 7. The active regions AP of the second area RA may have a first conductivity type that is identical to the conductivity type of the substrate 100, and the source/drain junction regions 120 of the second area RA may have a second conductivity type different from the conductivity type of the substrate 100. The pair of dummy gate structures DGS may be disposed between the reading gate structures RGS adjacent to each other in the first direction D1. In some example embodiments, since the second areas RA are shifted at regular intervals (e.g., a distance twice the pitch of the gate structures WGS, RGS and DGS) in the first direction D1 from the first areas WA, the pair of reading gate structures RGS may be aligned in the second direction D2 with the dummy gate structures DGS between the first areas WA.

The source/drain contacts 132a and 132b may be disposed between the gate structures WGS, RGS and DGS. The first source/drain contacts 132a of the first area WA may be disposed between the pair of writing gate structures WGS and may be commonly connected to the source/drain junction regions 120 arranged in the second direction D2. The first source/drain contacts 132a of the second area RA may be disposed between the pair of reading gate structures RGS and may be commonly connected to the source/drain junction regions 120 arranged in the second direction D2. As viewed in plan view, the first source/drain contacts 132a may extend in the second direction D2 to have bar shapes cross the active regions AP of the first area WA or the second area RA.

In some example embodiments, each or at least one of the second contacts 132b may be commonly connected to the source/drain junction regions 120 between the writing gate structure WGS and one dummy gate structure DGS adjacent thereto, and may further be commonly connected to the source/drain junction regions 120 between the reading gate structure RGS aligned in the second direction D2 with the one dummy gate structure DGS and another dummy gate structure DGS adjacent the reading gate structure RGS. In other words, the second source/drain contact 132b may be commonly connected to the source/drain junction regions 120 of the first area WA that are arranged in the second direction D2 and the source/drain junction regions 120 of the second area RA that are arranged in the second direction D2. Accordingly, the second source/drain contact 132b may serve as the connection structure 130 described with reference to FIGS. 4 through 7. Therefore, the second source/drain contact 132b may electrically connect one end of the first transistor to one end of the second transistor adjacent thereto. As viewed in plan view, the second source/drain contacts 132b may extend in the second direction D2 to have bar shapes all crossing the active regions AP of the first and second areas WA and RA.

The bit line contact BC may be provided in the second interlayer dielectric layer 150 to electrically connect the bit line BL on the second interlayer dielectric layer 150 to the first source/drain contact 132a between the pair of reading gate electrodes RGS.

Figure 11:
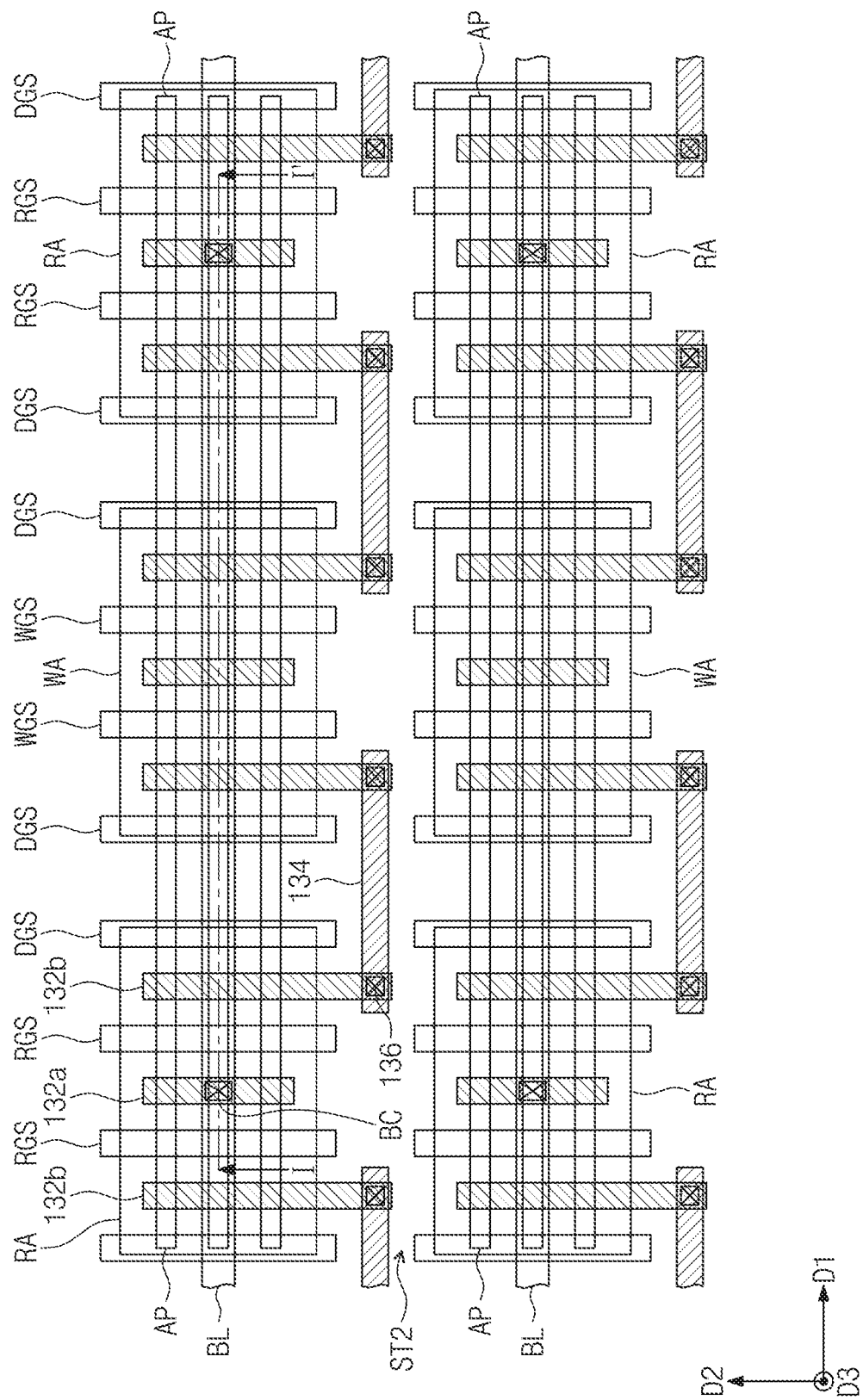
FIG. 11 is a plan view illustrating a semiconductor device according to some example embodiments.
Figure 12:
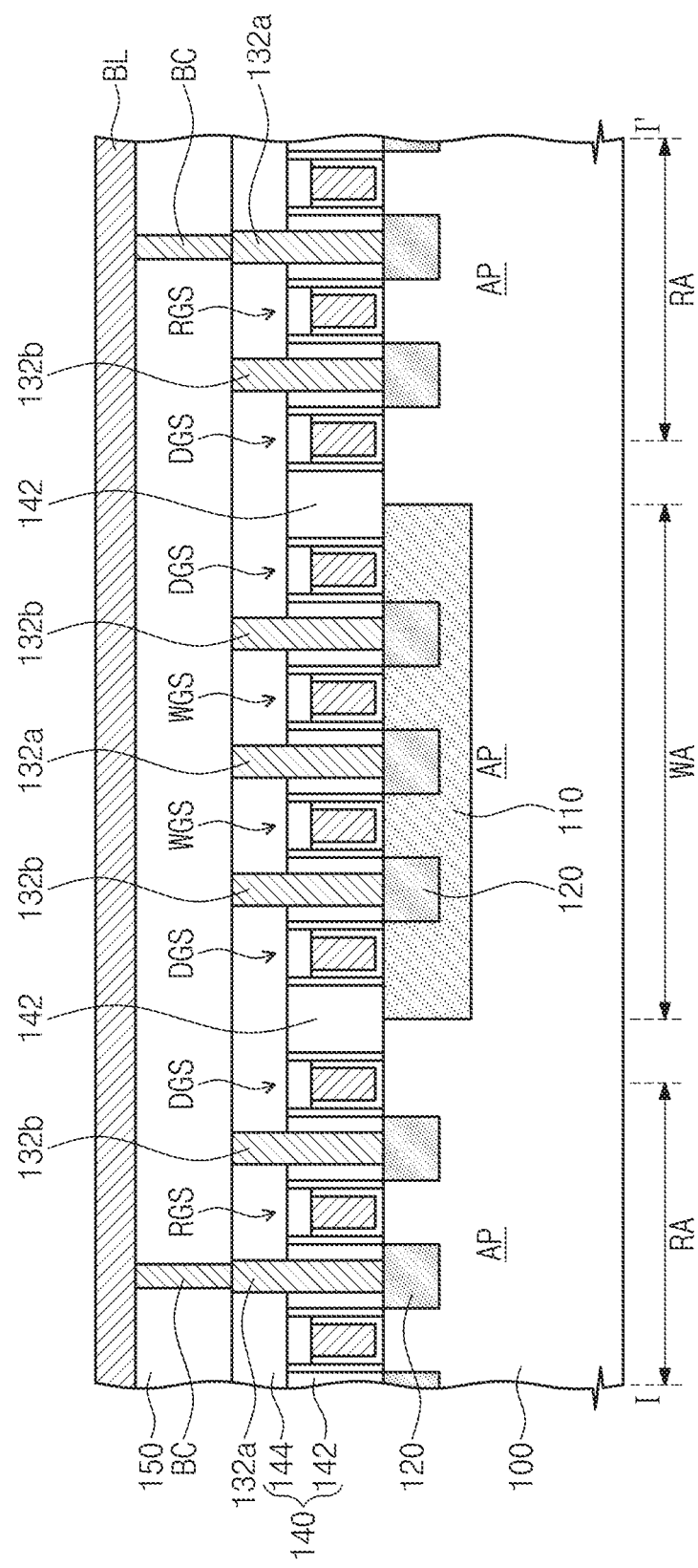
FIG. 12 is a cross-sectional view taken along line I-I' of FIG. 11.

FIG. 11 is a plan view illustrating a semiconductor device according to some example embodiments of the present inventive concepts. FIG. 12 is a cross-sectional view taken along line I-I' of FIG. 11. In the description that follows, the description of features that are the same as those in the above-mentioned example embodiments will be omitted for brevity and the description of features that are different from those in FIGS. 4 through 7 will be mainly explained below.

Referring to FIGS. 11 and 12, the active regions AP may extend in the first direction D1 to cross the plurality of first and second areas WA and RA alternatingly arranged in the first direction D1. The semiconductor device may have no first device isolation layer ST1 in the substrate 100 between the first area WA and the second area RA. The dummy gate structures DGS may be disposed on the active regions AP between the writing and reading gate structures WGS and RGS adjacent to one another and may cross the writing and reading gate structures WGS and RGS. The well impurity region 110 may be formed to overlap the writing gate structures WGS and the source/drain junction regions 120 of the first area WA, but not the reading gate structures RGS and the source/drain junction regions 120 of the second area RA. For example, the well impurity region 110 may have vertical boundaries each positioned on a virtual vertical line crossing between the two dummy gate structures DGS respectively of the first and second areas WA and RA adjacent to each other in the first direction D1. Other elements may be substantially identical or similar to elements described with reference to FIGS. 4 through 7.

According to some example embodiments, the active region under the writing gate electrode may be formed to have a conductivity type that is different from the conductivity type of the substrate such that a gate leakage current occurring between the writing gate electrode and the active region thereunder may be reduced. It therefore is possible to alleviate non-linearity of read current with respect to bit line voltage owing to the gate leakage current and improve the characteristics of semiconductor device. Moreover, the writing gate electrode and its adjacent reading gate electrode may be formed not to share the source/drain junction region therebetween. For example, the device isolation layer may be formed to separate the active region on which the writing gate electrode from the active region on which the reading gate electrode, and/or the dummy gate structure may be formed between the writing gate electrode and the reading gate electrode, which may increase an interval between the writing gate electrode and the reading gate electrode. It therefore may be easy to form the well impurity region overlapping the writing gate electrode but with the reading gate electrode. As a result, the example embodiments may acquire an increased fabrication margin and/or a good distribution of chip characteristics.

Although some example embodiments have been described in connection with the example embodiment illustrated in the accompanying drawings, they are not limited thereto. It will be apparent to those skilled in the art that various substitution, modifications and changes may be thereto without departing from the scope and spirit of some example embodiments.

What is claimed is:

1. A semiconductor device comprising:
   a substrate including a first active region and a second active region, the first active region includes a well impurity region in an upper portion thereof;
   a first source/drain junction region and a second source/drain junction region formed in the well impurity region and directly connected with the well impurity region, the first source/drain junction region and the second source/drain junction region having bottom surfaces that are higher than a bottom surface of the well impurity region;
   a third source/drain junction region and a fourth source/drain junction region formed in the second active region and directly connected with the second active region;
   a writing gate electrode between the first source/drain junction region and the second source/drain junction region;
   a reading gate electrode between the third source/drain junction region and the fourth source/drain junction region;
   a first gate insulation pattern between the well impurity region and the writing gate electrode;
   a second gate insulation pattern between the second active region and the reading gate electrode;
   a connection structure connecting the first source/drain junction region to the fourth source/drain junction region, at least a portion of the connection structure embedded in a first interlayer dielectric layer, the connection structure being above the first and fourth source/drain junction;
   the well impurity region having a same conductivity type as the first to fourth source/drain junction regions, and
   a lower portion of the first active region and the second active region having a conductivity type that is different from the conductivity type of the first to fourth source/drain junction regions.

2. The semiconductor device of claim 1, further comprising:
   a device isolation layer in the substrate between the first active region and the second active region,
   wherein the first and fourth source/drain junction regions are spaced apart from each other with the device isolation layer immediately therebetween.

3. The semiconductor device of claim 1, wherein the connection structure comprises:

source/drain contacts respectively connected to the first and fourth source/drain junction regions; and a connecting conductive line connecting the source/drain contacts to each other.

4. The semiconductor device of claim 3, wherein the source/drain contacts are embedded in the first interlayer dielectric layer, and the connecting conductive line is on the first interlayer dielectric layer.

5. The semiconductor device of claim 4, wherein the connecting conductive line is embedded in a second interlayer dielectric layer.

6. The semiconductor device of claim 1, further comprising:

a bit line connected to the third source/drain junction region.

7. The semiconductor device of claim 1, wherein the well impurity region and the first to fourth source/drain junction regions have an n-type conductivity, and the lower portion of the first active region and the second active region have a p-type conductivity.

8. A semiconductor device comprising:

a substrate including a first active region and a second active region, the first active region includes a well impurity region in an upper portion thereof, a lower portion of the first active region and the second active region having a first conductivity type, the well impurity region having a second conductivity type, the first conductivity type and the second conductivity type being different, the first active region being separated from the second active region;

a first source/drain junction region and a second source/drain junction region formed in the well impurity region and directly connected with the well impurity region, the first source/drain junction region and the second source/drain junction region having bottom surfaces that are higher than a bottom surface of the well impurity region;

a third source/drain junction region and a fourth source/drain junction region formed in the second active region and directly connected with the second active region;

a writing gate electrode between the first source/drain junction region and the second source/drain junction region;

a reading gate electrode between the third source/drain junction region and the fourth source/drain junction region;

a connection structure connecting the first source/drain junction region to the fourth source/drain junction region, at least a portion of the connection structure being embedded in a first interlayer dielectric layer.

9. The semiconductor device of claim 8, further comprising:

a first gate insulation pattern between the well impurity region and the writing gate electrode; and a second gate insulation pattern between the second active region and the reading gate electrode.

10. The semiconductor device of claim 8, wherein the first conductivity type is different from a conductivity type of the first and second source/drain junction regions; and the second conductivity type is same as the conductivity type of the first and second source/drain junction regions.

11. The semiconductor device of claim 8, wherein the first source/drain junction region is at one side of the at least one writing gate electrode; and the fourth source/drain junction region is at one side of the reading gate electrode.

12. The semiconductor device of claim 8, wherein the connection structure includes source/drain contacts respectively connected to the first and fourth source/drain junction regions, and a connecting conductive line connects the source/drain contacts to each other;

the source/drain contacts are embedded in the first interlayer dielectric layer, and the connecting conductive line is on the first interlayer dielectric layer.

13. The semiconductor device of claim 12, wherein the connecting conductive line is embedded in a second interlayer dielectric layer.

14. The semiconductor device of claim 8, wherein the first conductivity type is p-type, and the second conductivity type is n-type.

15. A semiconductor device comprising:

a substrate including a first active region and a second active region, the first active region include a well impurity region in an upper portion thereof;

a first device isolation layer on the substrate and defining the first and second active regions;

a second device isolation layer on the substrate, the second device isolation layer being between the first and second active regions, such that the first active region is separated from the second active region;

a first source/drain junction region and a second source/drain junction region formed in the well impurity region and directly connected with the well impurity region;

a third source/drain junction region, a fourth source/drain junction region, and a fifth source/drain junction region formed in the second active region and directly connected with the second active region;

a bit line connected to the third source/drain junction region, a writing gate electrode between the first source/drain junction region and the second source/drain junction region;

a left reading gate electrode between the third source/drain junction region and the fourth source/drain junction region, the left reading gate electrode configured to electrically connect the writing gate electrode of the first active region and the bit line;

a right reading transistor including a right reading gate electrode between the third source/drain junction region and the fifth source/drain junction region, the right reading gate electrode configured to electrically connect a right writing transistor and the bit line;

a left connection structure connecting the first source/drain junction to the fourth source/drain junction region;

a right connection structure connecting the right writing transistor to the right reading transistor;

the well impurity region having a same conductivity type as the first to fourth source/drain junction regions, a lower portion of the first active region and the second active region having a conductivity type that is different from a conductivity type of the first to fourth source/drain junction regions, and a bottom surface of the first device isolation layer and a bottom surface of the second device isolation layer being at a same level.

16. The semiconductor device of claim 15, wherein at least a portion of the left connection structure is embedded in a first interlayer dielectric layer.

17. The semiconductor device of claim 16, wherein:
the left connection structure includes source/drain contacts respectively connected to the first and fourth source/drain junction regions, and a left connecting conductive line connects the source/drain contacts to each other;
the source/drain contacts are embedded in the first interlayer dielectric layer, and
the left connecting conductive line is on the first interlayer dielectric layer.

18. The semiconductor device of claim 17, wherein the left connecting conductive line is embedded in a second interlayer dielectric layer.

19. The semiconductor device of claim 15, further comprising:
gate spacers on side walls of the writing gate electrodes and the reading gate electrodes.

20. The semiconductor device of claim 15, wherein the first and fourth source/drain junction regions are spaced apart from each other with the second device isolation layer immediately therebetween.

21. The semiconductor device of claim 15, wherein
the well impurity regions and the first to fourth source/drain junction regions have an n-type conductivity, and
the lower portion of the first left and first right active regions and the second active region have a p-type conductivity.

* * * * *